US006247939B1

(12) United States Patent
Bestul et al.

(10) Patent No.: US 6,247,939 B1
(45) Date of Patent: Jun. 19, 2001

(54) CONNECTOR FOR MAKING MULTIPLE PRESSED CO-AXIAL CONNECTIONS HAVING AN AIR DIELECTRIC

(75) Inventors: Mark DeWayne Bestul, Poway; Leonard Harry Alton, Escondido; Terrence Evan Lewis; Ronald Jack Kuntz, both of San Diego, all of CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/639,308

(22) Filed: Aug. 14, 2000

(51) Int. Cl.[7] .............................. H01R 12/00; H05K 1/00

(52) U.S. Cl. ................................................................ 439/66

(58) Field of Search .................................. 439/66, 65, 78, 439/84, 608, 92, 75

(56) References Cited

U.S. PATENT DOCUMENTS 5,302,923 * 4/1994 Mason et al. .......................... 439/75
5,646,522 * 7/1997 Etemadpour et al. ................. 439/66
5,762,504 * 6/1998 Itoh ....................................... 439/66
6,079,987 * 12/1998 Matsunaga et al. .................. 439/66

* cited by examiner

*Primary Examiner*—Brian Sircus
*Assistant Examiner*—Javaid Nasri
(74) *Attorney, Agent, or Firm*—Charles J. Fassbender; Mark T. Starr; Lise A. Rode

(57) ABSTRACT

A connector for making multiple pressed co-axial connections is comprised of an electrically conductive block which has a top surface, a bottom surface, a plurality of signal holes which extend from the top surface to the bottom surface, and a ground terminal. Top and bottom electrically insulative plates are respectively attached to the top and bottom surfaces of the block. Each plate has alignment holes that are aligned with the signal holes; lying in each signal hole is the body of a respective signal contact; and each signal contact has two springy probes which extend from the body thru respective alignment holes in the top and bottom plates. These springy probes are for contacting external signal pads, and they hold the body of each signal contact such that it is surrounded by a uniform air gap in the center of its respective signal hole.

11 Claims, 6 Drawing Sheets

EQ. 1 $Zo = \frac{138}{\sqrt{\varepsilon_r}} \log (D/d)$

EQ. 2 $50 = 138 \log (D/0.036)$

EQ. 3 $D$ min. = 0.083 inches

CONNECTOR FOR MAKING MULTIPLE PRESSED CO-AXIAL CONNECTIONS HAVING AN AIR DIELECTRIC

BACKGROUND OF THE INVENTION

This invention relates to electro-mechanical connectors that make pressed electrical connections between matching sets of signal pads on two separate modules. More particularly, this invention relates to the structure of the above type of connectors where the pressed electrical connections that are made are co-axial connections.

In many types of digital electronic systems, pressed electrical connections are made between a set of multiple signal pads on one module and a matching set of signal pads on another module. One prior art structure for making pressed electrical connections is shown, for example, in U.S. Pat. No. 5,967,798 which is entitled "Integrated Circuit Module Having Springy Contacts Of At Least Two Different Types For Reduced Stress". Pressed Connections are used, instead of soldered connections, where the connections between the two modules need to be made and broken multiple times.

However, in the above-referenced patent, the pressed electrical connections which are made are not co-axial connections. With a pressed co-axial connection, one signal pad is connected to another signal pad by a springy signal contact which is surrounded by a ground conductor that is spaced-apart from the springy signal contact. In the above-referenced patent, the springy signal contact is not surrounded by any ground conductor or any other conductor.

When a springy signal contact is not surrounded by a ground conductor, the characteristic impedance of the contact will vary and is difficult to set to a particular desired value, such as fifty ohms. Consequently, reflections will occur in the electrical signals that are sent from one module thru the springy signal contact to the other module.

But, when the springy signal contact is surrounded by a ground conductor, the characteristic impedance of the contact is fixed and can be accurately set to a predetermined value Zo, where Zo equals $138/(Er)^{1/2}\log(D/d)$. Here, "d" is the diameter of the springy signal contact; "D" is the inside diameter of the ground conductor which surrounds the springy signal contact; and Er is the relative permitivity of a dielectric which fills the space between the ground conductor and the springy signal contact.

One way to fabricate a connector which makes multiple pressed co-axial connections is to start with a conductive block that has a plurality of holes of diameter D. Next, the holes are completely filled with a solid dielectric which has a relative permitivity Er, such as a plastic. Then, in the center of each dielectric filled hole, a smaller hole of diameter d; is drilled. Lastly, a springy signal contact is press-fit into each hole of diameter d; and a ground terminal is attached to the conductive block.

However, with the above connector, a decrease in yield occurs as the diameter D decreases. This is because as D decreases, the step of drilling the holes of diameter d becomes more difficult. Further, with the above connector, the maximum number of signal conductors per unit area is limited by the permitivity Er of the solid dielectric. This is because for any given Zo and d, the diameter D increases as Er increases. Also, with the above connector, costs are incurred by the steps of filling the holes of diameter D with the solid dielectric and subsequently drilling the smaller holes in that dielectric.

Accordingly, a primary object of the present invention is to provide a connector for making multiple pressed co-axial connections in which the above problems are avoided.

BRIEF SUMMARY OF THE INVENTION

In accordance with the present invention, a connector for making multiple pressed co-axial connections is comprised of an electrically conductive block which has a top surface, a bottom surface, a plurality of signal holes of diameter D which extend from the top surface to the bottom surface, and a ground terminal. Top and bottom electrically insulative plates are respectively attached to the top and bottom surfaces of the block; and each plate has alignment holes that are aligned with the signal holes. A plurality of signal contacts, each of which has a body of diameter d (where d is less than D), respectively lie in the signal holes; and, each signal contact also has two springy probes which extend from the body thru respective alignment holes in the top and bottom plates.

With the above connector, the springy probes in the alignment holes hold the body of each signal contact in the center of its respective signal holes; and thus, each signal contact is surrounded by an air gap. Air is a dielectric which has the smallest possible relative permitivity Er. Consequently, for any given characteristic impedance Zo and contact diameter d, the hole diameter D is minimized; and that maximizes the number of possible signal contacts per unit area.

Also with the above connector, the need to fill the signal holes with a solid dielectric and subsequently drill smaller holes in the dielectric, is eliminated. Consequently, the yield problem and costs associated with the filling and drilling steps are completely avoided.

DETAILED DESCRIPTION

Figure 1:
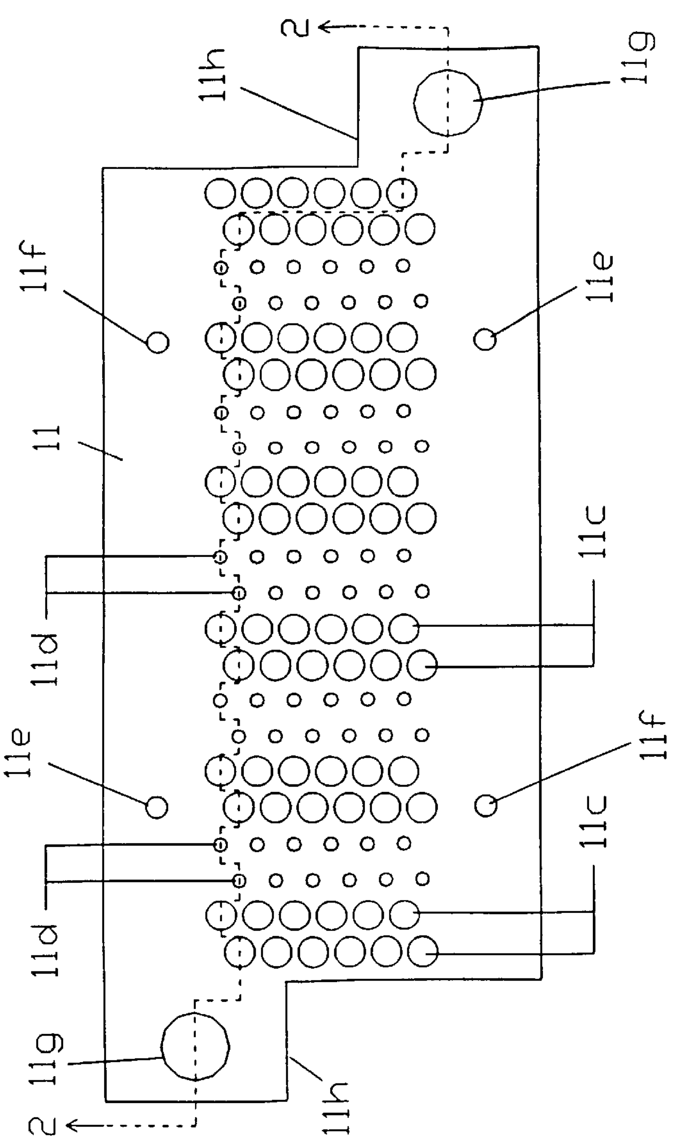
FIG. 1 is a top view of an electrically conductive block that is one component in a connector which constitutes a preferred embodiment of the present invention.
Figure 2:
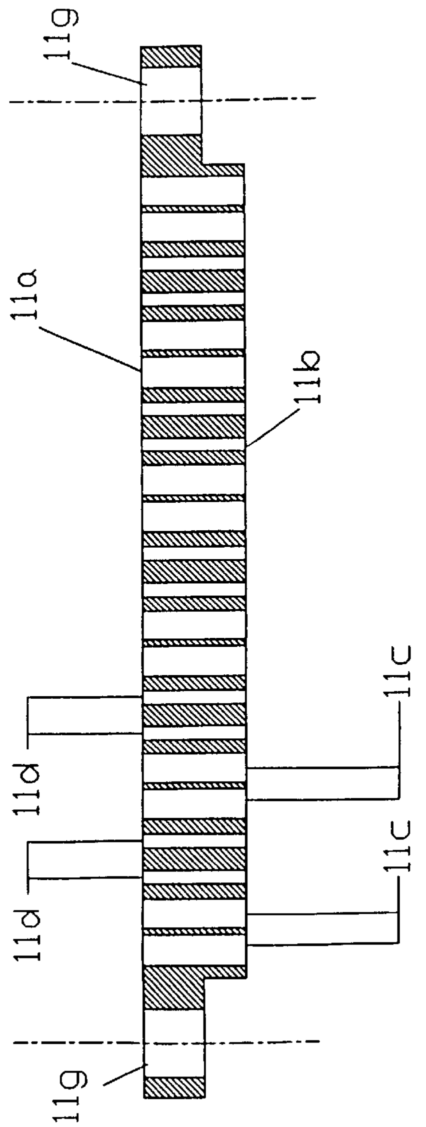
FIG. 2 is a sectional view taken along lines 2—2 thru the block of FIG. 1.

In FIGS. 1 and 2, component 11 is an electrically conductive block that is one component in a connector which constitutes a preferred embodiment of the present invention. This block 11 has a top surface 11*a*, and a bottom surface 11*b*. A plurality of signal holes 11*c* and a plurality of ground holes 11*d* extend thru the block 11 from the top surface 11*a* to the bottom surface 11*b*. Each signal hole has a diameter D, and each ground hole has a smaller diameter d. These signal holes 11*c* and ground holes 11*d* are arranged in the block 11 in a pattern, as shown, of seventy-two signal holes and sixty ground holes.

The conductive block 11 also has three other pairs of holes 11*e*, 11*f*, and 11*g*. The holes 11*e* are threaded screw holes which extend from the top surface 11*a* thru the block 11. The holes 11*f* are threaded screw holes which extend from the bottom surface 11*b* thru the block 11. And, the holes 11*g* are unthreaded holes which extend thru two flanges 11*h* on the block. This block 11 can be made of any electrical conductor, such as copper or aluminum, for example.

Figure 3:
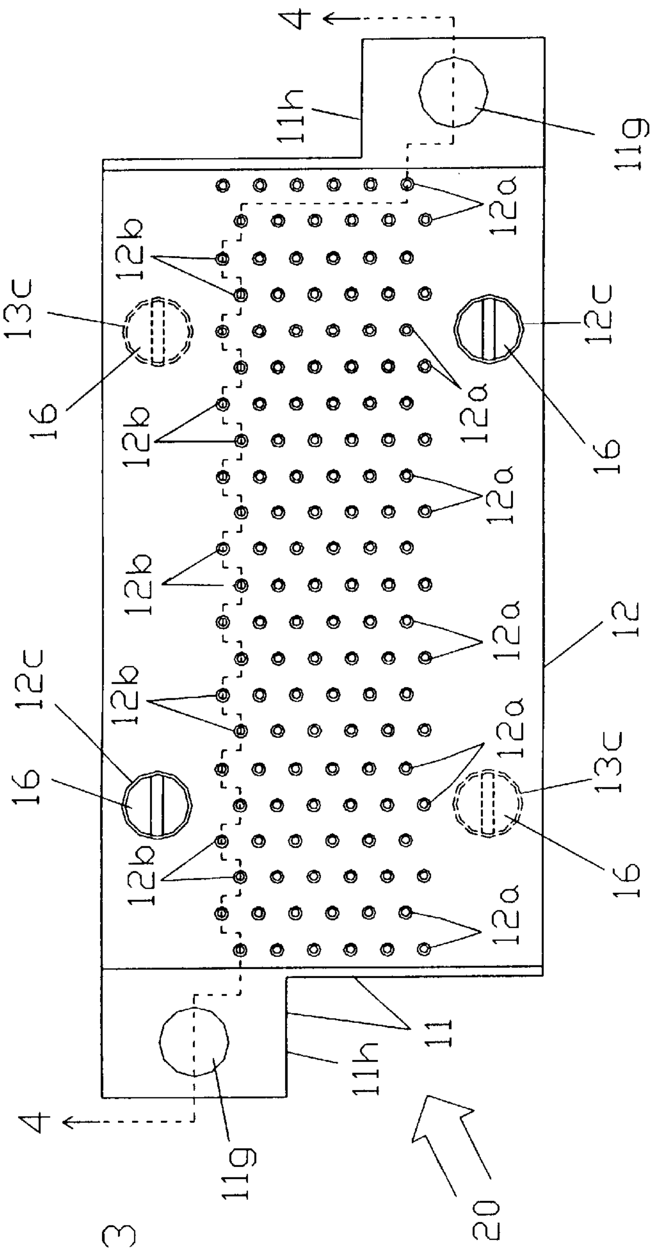
FIG. 3 is a top view of a connector which includes the block of FIGS. 1 and 2, and which is a preferred embodiment of the present invention.
Figure 4:
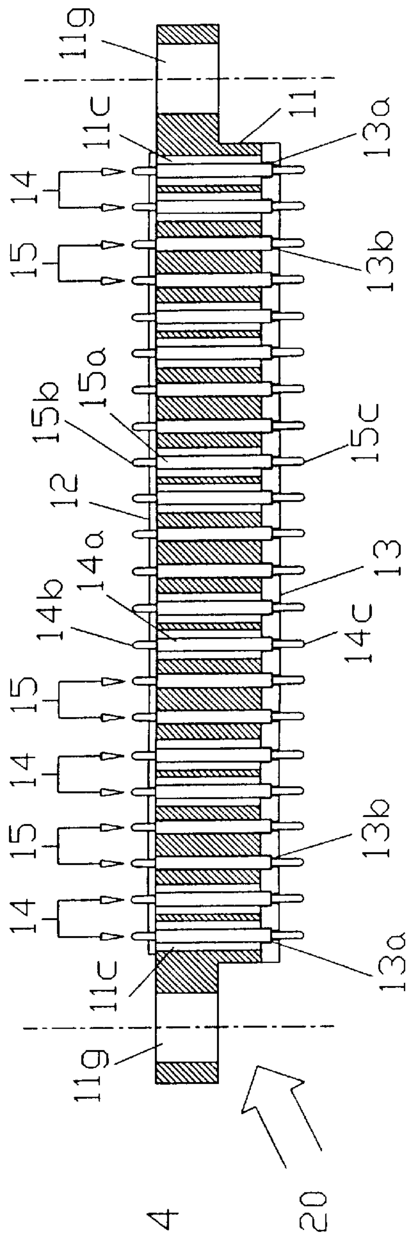
FIG. 4 is a sectional view taken along lines 4—4 thru the connector of FIG. 3.

The conductive block 11 is combined with other components to form a connector 20, which is one preferred embodiment of the present invention, is shown in FIGS. 3 and 4. There, the conductive block 11 is coupled to five different types of components 12, 13, 14, 15 and 16.

Component 12 is a top plate which is made of an electrically insulative material, such as a plastic, for example. This top plate 12 lies on the top surface 11*a* of the conductive block 11, and it has three sets of holes 12*a*, 12*b* and 12*c*.

The holes 12*a* are co-axially aligned with the signal holes 11*c* in the conductive block 11; and, the holes 12*b* are co-axially aligned with the ground holes 11*d* in the conductive block 11. Each of the holes 12*a* and 12*b* has a diameter dp which is smaller than the diameter d of the ground holes 11*d*. The holes 12*c* are co-axially aligned with the screw holes 11*e* in the conductive block 11, and their shape will be described in detail in conjunction with component 16.

Component 13 is a bottom plate which is similar, but not identical, to the top plate 12. This bottom plate 13 is made of an electrical insulative material, and it lies on the bottom surface 11*b* of the conductive block 11.

The bottom plate 13 has three sets of holes 13*a*, 13*b*, and 13*c* which respectively are co-axially aligned with the holes 11*c*, 11*d*, and 11*f* in the conductive block 11. One portion of each hole 13*a* and 13*b*, which faces towards the conductive block 11, has the diameter d; and the remaining portion of each hole 13*a* and 13*b*, which faces away from the conductive block 11, has the diameter dp. The holes 13*c* are the same shape as the holes 12*c* in the top plate 12.

Component 14 is a signal contact for carrying an electrical signal. A separate signal contact is provided for each signal hole 11*c* in the conductive block 11. Each signal contact has a cylindrical body 14*a* of diameter d, and two springy probes 14*b* and 14*c* of diameter dp−Δ. Here, Δmakes the diameter of the probes slightly smaller than the diameter of the holes 12*a* and 13*a*.

The body 14*a* of each signal contact 14 lies in a respective signal hole 11*c*; and the two springy probes 14*b* and 14*c* of each signal contact pass freely thru respective holes 12*a* and 13*a* in the top plate 12 and the bottom plate 13. Those springy probes 14*b* and 14*c* hold the body 14*a* of the signal contact 14 in the center of its respective signal hole; and thus, the body 14*a* of each signal contact 14 is surrounded by a uniform air gap in its respective signal hole. The width of that air gap is (D−d)/2.

Component 15 is a ground contact for carrying a ground voltage. A separate ground contact is provided for each ground hole 11*d* in the conductive block 11. Each ground contact 15 has a cylindrical body of diameter d and two springy probes 15*b* and 15*c* of the diameter dp−Δ. The body of each ground contact 15 is held tightly in a respective ground hole 11*d*; and the two springy probes 15*b* and 15*c* of each ground contact 15 pass freely thru respective holes 12*b* and 13*b* in the top plate 12 and the bottom plate 13.

Component 16 is a screw. Two screws 16 fasten the top plate 12 to the block 11 by screwing into the holes 12*c* and 11*e*. Similarly, two screws 16 fasten the bottom plate 13 to the block 11 by screwing into the holes 13*c* and 11*f*. Each screw 16 has a flat head with tapered sides; and each hole 12*c* and 13*c* has matching tapered sides. Thus, the heads of the screws 16 fit into the top plate 12 and the bottom plate 13. Only the contact probes 14*b*, 14*c*, 15*b* and 15*c* extend past the top plate 12 and bottom plate 13.

Figures 5, 6:
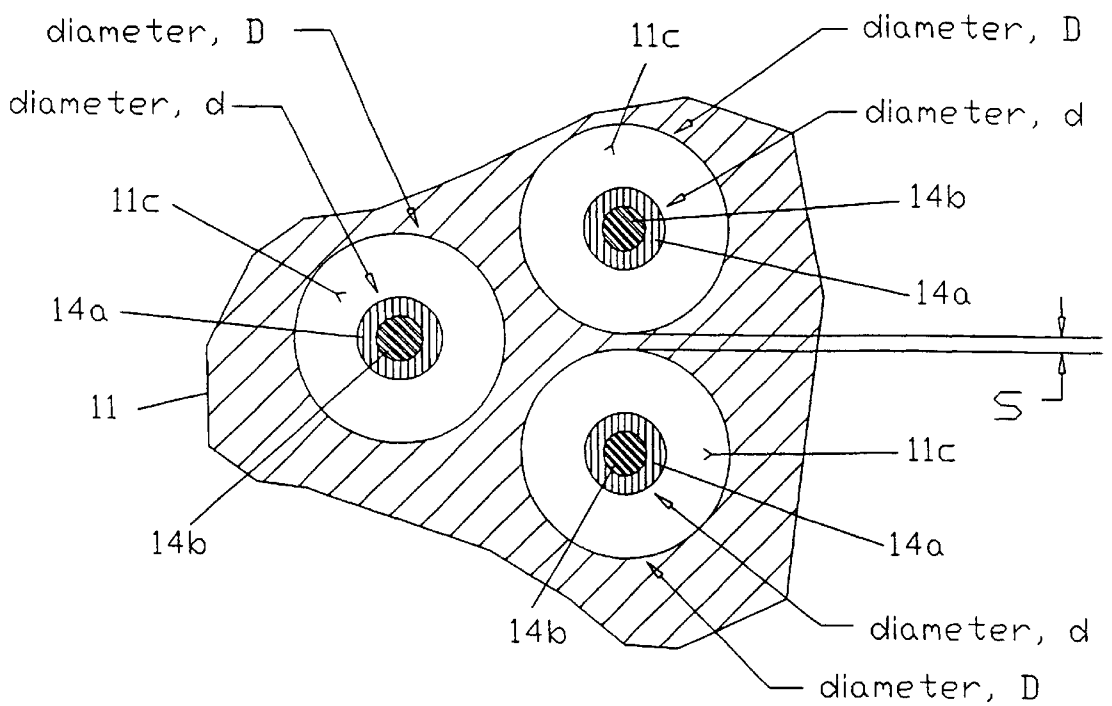
FIG. 5 is an enlarged view of two signal contacts in their respective signal holes within the connector of FIGS. 3 and 4.
FIG. 6 is a set of equations which indicate how the signal contact diameter d, the signal hole diameter D, and the signal contact characteristic impedance are interrelated in the connector of FIGS. 3 and 4.

In FIG. 5, the signal contacts 14 are shown as viewed parallel to their axis. In that view, the body 14*a* of each signal contact 14 looks like a circle of diameter d; and each signal hole 11*c* looks like a concentric circle of diameter D. FIG. 5 also shows that the signal holes 11*c* are separated by a spacing of "S" within the conductive block 11.

When the body 14*a* of each signal contact 14 is co-axially aligned in its signal holes 11*c*, as shown in FIG. 5, the characteristic impedance Zo of each signal contact 14 is given by equation 1 of FIG. 6. There, the parameter Er is the relative permitivity of the dielectric which fills the gap, of width (D−d)/2, between the body 14*a* of the signal contact 14 and the conductive block 11.

In accordance with the present invention, the gap between the body 14*a* of each signal contact 14 and the conductive block 11, is filled with air. That is made feasible by the springy probes 14*b* and 14*c* which hold the body 14*a* of each signal contact 14 in the center of its respective signal hole 11*c*. Air is a desirable dielectric because it has the smallest possible relative permitivity of "1"; and thus for any given Zo and diameter d, the diameter D is a minimum. Consequently, the number of signal contacts per unit area is maximized.

As one specific example, suppose that the characteristic impedance Zo for each signal contact is 50 ohms, and suppose that the body 14*a* of each signal contact 14 cannot be made with a diameter smaller than 0.036 inches. For that example, equation 1 of FIG. 6 reduces to equation 2. Then, equation 2 of FIG. 6 can be solved for the unknown diameter D; and the result is given by equation 3 as D=0.083 inches. By comparison, if the dielectric permitivity °r is bigger than "1", then the diameter D will need to be bigger than 0.083 inches.

Figure 7:
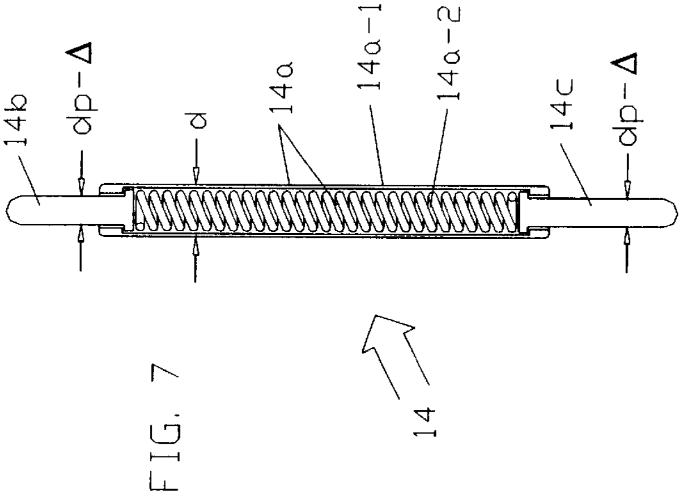
FIG. 7 is an enlarged view of one internal structure for the signal contacts in the connector of FIGS. 3 and 4.

Next, with reference to FIG. 7, additional details of one preferred structure for each signal contact 14 will be described. In FIG. 7, the signal contact 14 has a body 14*a* which is comprised of a hollow cylinder 14*a*-1 of diameter d, and a helical spring 14*a*-2 which is inside of the hollow cylinder 14*a*-1. This spring 14*a*-2 is compressed by the two springy probes 14*b* and 14*c*. Each probe 14*b* and 14*c* includes a solid metal cylinder of diameter dp−Δ. This cylinder has a head which is trapped inside of the hollow cylinder 14*a*-1 and pushes against the spring 14*a*-2. The same structure which is shown in FIG. 7 also is used for each of the ground contacts 15.

To assemble all of the components 11–16 in the connector 20, the following process preferably is used. Initially, the bottom plate 13 is attached to the conductive block 11 by two of the screws 16. Then the ground contacts 15 are pushed into the ground holes 11*d* of the conductive block 11 until the springy probes 15*c* extend through the holes 13*b* in the bottom plate 13.

Next, the signal contacts 14 are put into the signal holes 11*c* of the conductive block 11. During this step, one end of the body 14*a* of each signal contact 14 is pushed into the wide portion of a respective hole 13*b* in the bottom plate 13. Then, while the bottom plate 13 is held in a horizontal plane, the opposite end of each signal contact 14 can be moved sideways until each signal contact body 14*a* is centered, or nearly centered, in its respective signal hole 11*c*.

Figure 8A:
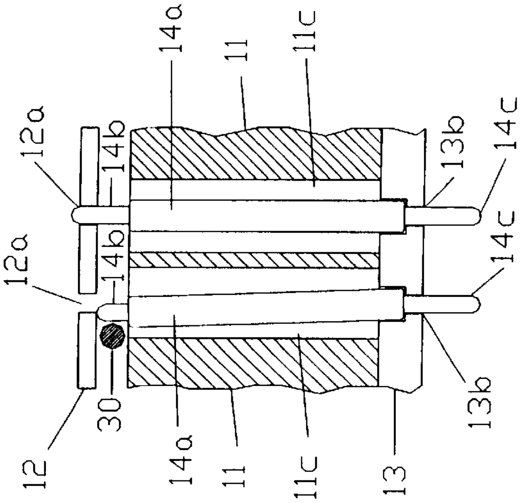
FIGS. 8A and 8B show certain steps which are used to assemble the connector of FIGS. 3 and 4.

After the above step, the top plate 12 is placed close to the top surface 11*a* of the signal block 11 as shown in FIG. 8A. In that position, the springy probe 14*b* of a signal contact 14 will pass thru its respective hole 12*a* in the top plate 12 if the body 14*a* of the signal contact is centered in its signal hole 11*c*. Otherwise, the springy probe 14*b* will hit the top plate 12.

In the right half of FIG. 8A, the body 14*a* of the signal contact is shown as being centered in its respective signal hole 11*c*. Consequently, the springy probe 14*b* in the right half of FIG. 8A passes thru the respective hole 12*a* in the top plate 13. By comparison, in the left half of FIG. 8A, the body 14*a* of the signal contact is shown as being uncentered in the respective signal hole 11*c*; and thus the springy probe 14*b*, in the left half of FIG. 8A, hits the top plate 12.

Figure 8B:
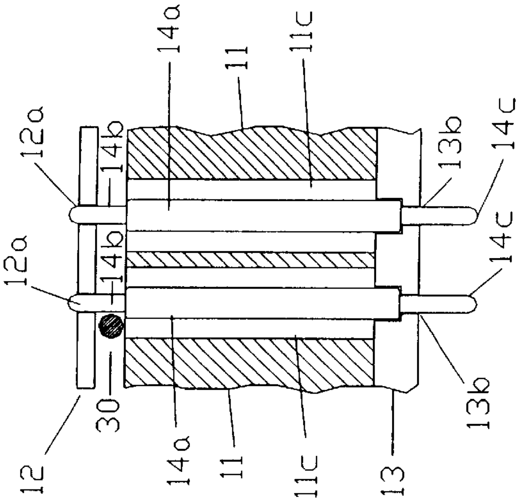

To fix the above problem, a tool such as a stiff wire 30 is inserted between the top plate 12 and the conductive block 11. Then, by pushing the wire 30 against the springy probe 14*b*, that probe can be moved sideways until it passes thru its respective hole 12*a* in the top plate 12. The result of this pushing step is shown in FIG. 8B. Thereafter, when all of the springy probes 14*b* pass thru their respective holes 12*a*, the top plate 12 is fastened to the top surface 11*a* of the conductive block 11 by two of the screws 16.

Figure 9B:
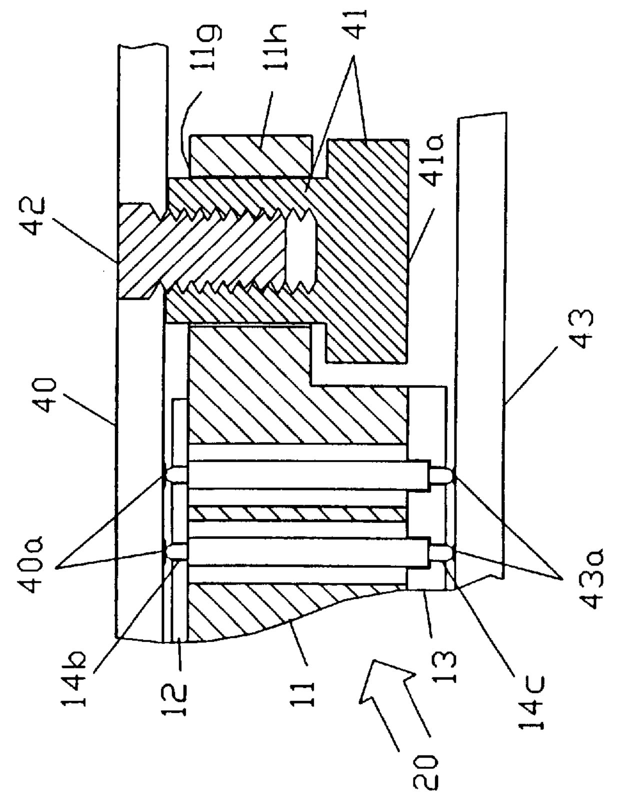
FIGS. 9A and 9B show how the connector of FIGS. 3 and 4 can be used to make multiple pressed co-axial connections between matching sets of signal pads on two separate printed circuit boards.
Figure 9A:
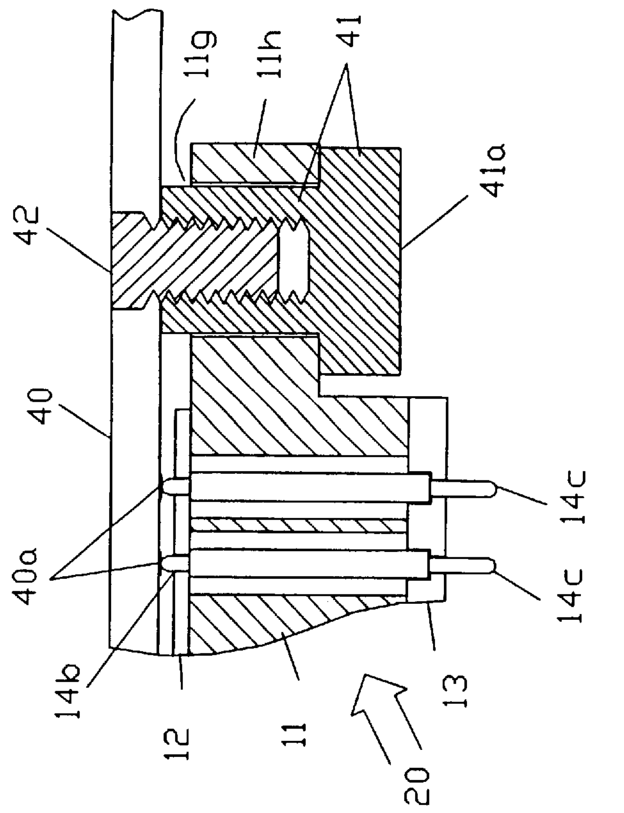

Referring next to FIGS. 9A and 9B, they show one preferred subassembly which uses the connector 20 to make pressed co-axial electrical connections between matching sets of signal pads on two separate modules. In those FIGS. 9A and 9B, each of the reference numerals 11, 12, 13, 14*b*, 14*c* 11*g*, and 11*h* identifies a particular portion of the connector 20 that was previously described. In addition, in FIG. 9A, four new items are identified by reference numerals 40, 40*a*, 41, and 42; and in FIG. 9B, two more new items are identified by reference numerals 43 and 43*a*.

Item 40 is a printed circuit board which has a set of signal pads 40*a* that are aligned with all of the springy probes 14*b* for the signal contacts 14 in the connector 20. Also, the printed circuit board 40 has a set of ground pads (which are not shown) that are aligned with all of the springy probes 15*b* for the ground contacts 15 in the connector 20. Item 41 is a bushing, and item 42 is a screw. A separate bushing 41 fits into each of the holes 11*g* in the connector 20, and each bushing is held against the printed circuit board 40 by a separate screw 42.

When the connector 20 is coupled to the printed circuit board 40 as shown in FIG. 9A, each springy probe 14*b* for a signal contact 14 presses against a separate signal pad 40*a* and similarly, each springy probe 15*b* for a ground contact 15 (not shown) presses against a separate ground pad (not shown). Thus, as a reaction to the pressing forces, the conductive block 11 is pushed away from the printed circuit board 40 until the flanges 11*h* hit the heads 41*a* of the bushings 41.

In FIG. 9B, a second printed circuit board 43 is pressed against the connector 20 as shown. This second printed circuit board 43 has signal pads 43*a* that are aligned with and push on the springy probes 14*c* for the signal contacts 14. Similarly, the printed circuit board 43 has ground pads (not shown) that are aligned with and push on the springy probes 15*c* for the ground contacts 15 (not shown). Due to the above pushing, the conductive block 11 is moved towards the first printed circuit 40; and there, the conductive block 11 "floats" between the two printed circuit boards 40 and 43. In FIG. 9B, electrical signals are sent thru the connector 20 between the two sets of signal pads 40*a* and 43*a* while ground voltage is applied to the conductive block 11.

A connector 20, which is one preferred embodiment of the present invention, has now been described in detail. Also, one preferred method of fabricating the connector 20, and one preferred subassembly which uses the connector 20 to make pressed co-axial connections, has been described in detail. In addition, however, various changes and modifications will now be described which can be made to the above details without departing from the nature and spirit of the invention.

Figure 10:
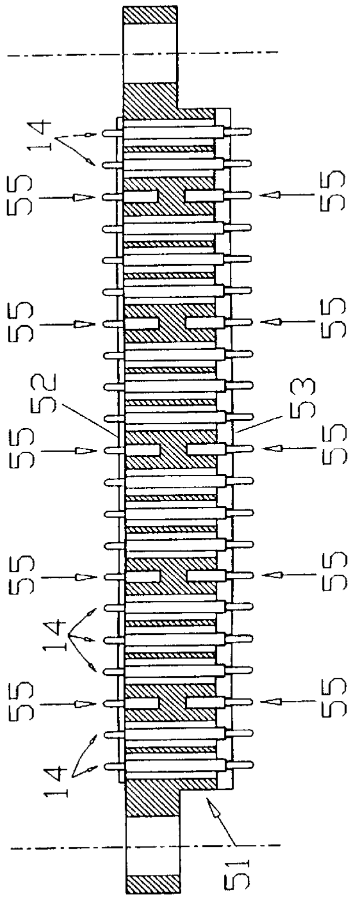
FIG. 10 shows a connector which is a second preferred embodiment of the present invention.

One modification is shown in FIG. 10; and to understand that modification, FIG. 10 should be compared to the previously described FIG. 2. In FIG. 10, each component which is modified has the same reference numeral as given in FIG. 2 plus the quantity of 40. For example, component 5 in FIG. 10 is a modification of component 11 in FIG. 2. Also, each component which is unmodified in FIG. 10 has the same reference numeral as given in FIG. 2.

One change in FIG. 10 is that each ground contact 55 only extends partway thru the conductive block 51. Another change in FIG. 10 is that the signal contacts 14 and ground contacts 55 are arranged in a different pattern in conductive block 51. Thus to accommodate the above two changes, the holes for the springy probes of the contacts 15 and 55 are arranged in a different pattern in the top plate 52 and bottom plate 53.

Figure 11:
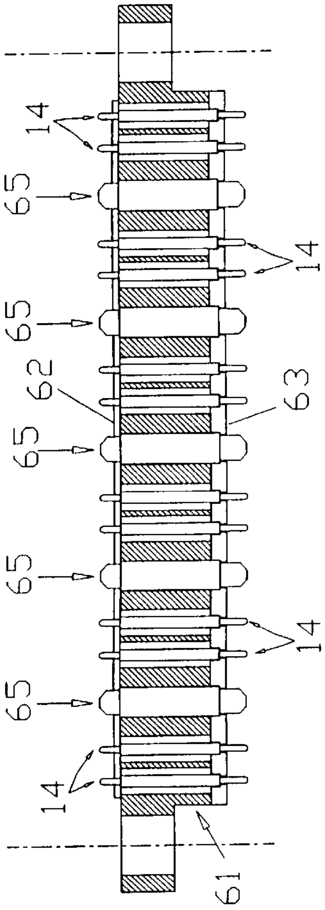
FIG. 11 shows a connector which is a third preferred embodiment of the present invention.

Next, a second modification will be described with reference to FIG. 11. To understand this FIG. 11 modification, it also should be compared to FIG. 2. In FIG. 11, each component which is modified has the same reference numeral as given in FIG. 2 plus the quantity of 50. Also, in FIG. 11, each component which is unmodified has the same reference numeral as in FIG. 2.

One change in FIG. 11 is that each ground contact 65 has a larger diameter than a signal contact 14. Due to this modification, the springy probe of each ground contact 65 has an increased surface area on its top, and that lowers the resistance between each ground contact and its contact pad on a printed circuit board. Thus the IR voltage drop across each ground contact is reduced, and that improves noise margin for the signals which pass through the signal contacts 14. Suitably, the diameter of each ground contact 65 is 50%–500% larger than the diameter of a signal contact.

Figure 12:
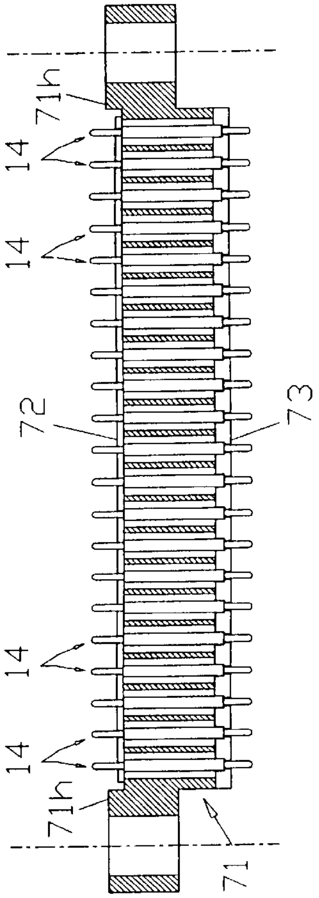
FIG. 12 shows a connector which is a fourth preferred embodiment of the present invention.

Next, a third modification will be described in conjunction with FIG. 12. In FIG. 12, each component which is modified has the same reference numeral as given in FIG. 2 plus the quantity 60; and each unmodified component has the same reference numeral as in FIG. 2.

One change in FIG. 12 is that the conductive block 71 is coupled to a ground voltage thru its two flanges 71*h*. To enable that to occur, each flange 71*h* is changed such that it extends above the top plate 72. Thus, when the connector 71 is coupled to a printed circuit board, such as the circuit board 40 in FIG. 9A, each flange 71*h* will contact a ground pad on the printed circuit board which carries the ground voltage. Due to the above change, the entire portion of the conductive block 71 which lies between the two flanges 71*h* is used to hold the signal contacts 14.

As still another modification, the detailed structure for the signal contacts 14 which is shown in FIGS. 5 and 7 can be changed. For example, the helical spring **14*a*-2 can be replaced with a wad of a thin strand of springy wire. Also, the circular hollow cylinder 14*a*-1 can be replaced with a hollow cylinder that has a desired non-circular shape; but that will then change the expression for Zo which is given by equation 1 of FIG. 6**.

In view of all of the above, it is to be understood that the present invention is not limited to the details of any one particular embodiment but is defined by the appended claims.

What is claimed is:

1. A co-axial connector which is comprised of:

an electrically conductive block which has a top surface, a bottom surface, a plurality of signal holes which extend from said top to said bottom surface, and a ground terminal;

top and bottom electrically insulative plates which are respectively attached to said top and bottom surfaces, each plate having alignment holes that are aligned with said signal holes;

a plurality of signal contacts, each of which has a body that is narrower than a respective one of said signal holes and lies therein; and, each signal contact also having two springy probes which extend from said body thru said alignment holes in said top and bottom plates and thereby hold said body of said signal contact such that it is surrounded by an air gap in its respective signal hole.

2. The connector according to claim 1 wherein each alignment hole in one of said plates has a narrow portion which passes one of said springy probes and a wide portion into which an end of said body of one signal contact is press fit.

3. The connector according to claim 1 wherein said ground terminal includes a plurality of ground holes which extend completely thru said block; and a plurality of ground contacts, each of which has a body that fits tightly into a respective ground hole and has two springy probes that pass thru said top and bottom plates.

4. The connector according to claim 1 wherein said ground terminal includes a plurality of ground holes which extend partway thru said block; and a plurality of ground contacts, each of which has a body that fits tightly into a respective ground hole and has one springy probe that pass thru one of said plates.

5. The connector according to claim 1 wherein each signal hole has a circular cross-section with a diameter D, and said body of each signal contact has a circular cross-section with a smaller diameter d, where D and d are related by 50=138 log (D/d).

6. The connector according to claim 1 wherein said air gap is of a predetermined size which causes each signal contact to have a particular characteristic impedance.

7. The connector according to claim 1 wherein said body of each signal contact includes a hollow cylinder which holds a spring that is compressed by said two springy probes.

8. The connector according to claim 1 wherein said body of each signal contact has a circular cross-section with a predetermined minimum diameter.

9. The connector according to claim 1 wherein said signal holes are spaced-apart by a predetermined minimum spacing.

10. The connector according to claim 1 wherein each signal hole has a circular cross-section.

11. The connector according to claim 1 in combination with a printed circuit board that has a fastener which is attached to said connector such that said connector can be squeezed towards said printed circuit board in a range of positions while said springy probes that extend thru one of said plates contact respective signal pads on said printed circuit board.

* * * * *